(12) United States Patent
Kamiya et al.

(10) Patent No.: US 7,105,816 B2
(45) Date of Patent: Sep. 12, 2006

(54) ELECTRON BEAM DEVICE

(75) Inventors: Chisato Kamiya, Hitachinaka (JP);
Masahiro Akatsu, Hitachinaka (JP);
Mitsugu Sato, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 10/751,987

(22) Filed: Jan. 7, 2004

(65) Prior Publication Data

US 2004/0183017 A1    Sep. 23, 2004

(30) Foreign Application Priority Data

Jan. 7, 2003   (JP) ............... 2003-000750

(51) Int. Cl.
 H01J 37/29    (2006.01)
 H01J 37/244   (2006.01)
 G01N 23/04    (2006.01)

(52) U.S. Cl. .............. 250/311; 250/307; 250/397

(58) Field of Classification Search ........... 250/310, 250/311, 306
See application file for complete search history.

(56) References Cited

U.S. PATENT DOCUMENTS 5,578,821 A * 11/1996 Meisberger et al. ........ 250/310
5,866,905 A *  2/1999 Kakibayashi et al. ...... 250/311
5,981,947 A * 11/1999 Nakasuji et al. ........... 250/310
6,051,834 A *  4/2000 Kakibayashi et al. ...... 250/311

FOREIGN PATENT DOCUMENTS

| JP | 58-125352 | 8/1983 |
| JP | 6-139988  | 5/1994 |
| JP | 7-169429  | 7/1995 |
| JP | 07-335172 | 12/1995 |
| JP | 09-167591 | 6/1997 |

* cited by examiner

*Primary Examiner*—Jack I. Berman
(74) *Attorney, Agent, or Firm*—Dickstein Shapiro LLP

(57) ABSTRACT

Disclosed here is a high resolution scanning electron microscope having an in-lens type objective lens. The microscope is structured so as to detect transmission electrons scattering at wide angles to observe high contrast STEM images according to each sample and purpose.

A dark-field detector is disposed closely to the objective lens magnetic pole. The microscope is provided with means for moving the dark-field detector along a light axis so as to control the scattering angle of each detected dark-field signal.

5 Claims, 9 Drawing Sheets

BRIGHT-FIELD
IMAGE

← Polycarbonate
← REFLECTION LAYER
← UPPER PROTECTION LAYER
← RECORDING LAYER
← LOWER PROTECTION LAYER
← Polycarbonate

DARK-FIELD
IMAGE

DARK-FIELD
IMAGE
OBTAINED AT
INSUFFICIENT
(SMALL)
DETECTION
ANGLE

IMPROPER CONTRAST INVERSION FOR BRIGHT-FIELD

ELECTRON BEAM DEVICE

FIELD OF THE INVENTION

The present invention relates to an electron beam device and more particularly to a scanning electron microscope or its similar device capable of observing sample images (STEM images) as those of a transmission electron microscope.

BACKGROUND OF THE INVENTION

Generally, a scanning electron microscope scans an electron beam on a target sample and detects secondary or reflected electrons from the sample to obtain a sample image. If the sample to observe is a thin film of about 100 nm, most of the scanning electron beam transmits the sample. The intensity and scattering angle of the electrons of the beam that transmits the sample depend on the local state, thickness, and atom type of the sample such transmission electrons are detected and displayed to obtain the scanning transmission electron microscopy (STEM) image of the sample. The STEM image is divided into bright-field and dark-field images. Different signals are used to detect bright-field images and dark-field images. Bright-field images are obtained by detecting only the electrons that transmit the sample without scattering in the sample. The dark-field images are obtained by detecting the electrons that scatter in and transmit the sample. Generally, a circular detector is used for bright-field images while a torus detector is used for dark-field images.

FIG. 2 shows a block diagram of a general conventional STEM device. The general STEM device is similar in configuration to a transmission electron microscope (TEM) having an acceleration voltage of about 200 kV. A primary electron beam 1 emitted from an electron gun 2 is accelerated by an anode 4, focused by a first focusing lens 5, then scanned on a thin film sample 9 by a deflection coil 8. Electrons that transmit the thin film sample 9 disposed between upper and lower magnetic poles 12a and 12b of an objective lens 11 are focused by a control lens 22 disposed under the objective lens 11 so that the control lens 22 can control their scattering angles detected by a dark-field detector 14. Dark-field signals comprising elastic scattering electrons 13 are thus detected by the dark-field detector 14. Electrons 15 that transmit the dark-field detector 14 are detected by a bright-field detector 17 disposed still under the control lens 22.

The patent document 1 discloses a method for observing a sample using only one detector in which dark-field signals and bright-field signals are switched over by selecting the position of either bright-field image iris or dark-field image iris retained on a common iris base respectively. The patent document 2 discloses a method for enabling a scattering angle range to be selected using a plurality of irises disposed in a plurality of stages. The irises are all similar in mechanism to a camera shutter.

Patent document 1: Official gazette of JP-A No. 169429/1995

Patent document 2: Official gazette of JP-A No. 139988/1994

In recent years, along with the rapid progress of miniaturizing and multi-layering techniques of semiconductors, much attention has been paid to the STEM method that evaluates and measures the miniaturized structures of such semiconductors at their cross sectional views. For normal STEM observations, an acceleration voltage of about 200 kV is used. However, it is found that if an acceleration voltage of 50 kV and under (ex., 30 kV) is used, higher contrast bright-field STEM images are obtained. On the other hand, because the contrast (Z contrast) that comes to differ among atomic numbers of the elements of a sample can be observed clearly in dark-field images, the method for observing dark-field images is often combined with sample element analysis (X-ray analysis). Thus, the method is now considered to be very important similarly to the bright-field STEM method.

Usually, the objective lens of a STEM device is designed for observing thin films. As shown in FIG. 3, a thin film sample 9 is disposed approximately in the center between the upper and lower magnetic poles 12a and 12b of the objective lens 11. However, if the STEM device is premised to use the functions of the scanning electron microscope, it is specially structured to observe bulky samples at high resolution. As shown in FIG. 4, therefore, the sample observation plane (place where the primary electron beam is focused) is one-sided to become closer to the upper magnetic pole 12a of the objective lens 11. Consequently, if a STEM observation is to be made for a thin film sample put there, electrons 13 or 15 that transmit the thin film sample come to be affected strongly by the objective lens 11 until they pass the lower magnetic pole 12b of the objective lens 11. The electrons are thus focused again before they pass the lower magnetic pole 12b (FIG. 5). As a result, the electrons transmitting the lower magnetic pole 12b of the objective lens 11 go under the magnetic pole of the objective lens 11 at angles larger than the angles of the electrons scattering in the sample. In addition, if the acceleration voltage of the primary electron beam drops, the angle itself, at which the incident electron beam scatters in the thin film sample, increases. This is why it has been very difficult for conventional techniques to detect electrons scattering at high angles in the target sample, then transmitting the sample if the STEM observation is made using an in-lens type high resolution scanning electron microscope at an acceleration voltage of 50 kV and under. Because, electrons scattering at high angles in the sample, then transmitting the sample come to hit against the inner wall of the magnetic path provided at a halfway before they reach the control lens (C3) 22 disposed under the objective lens 11 or transmission electron detector.

SUMMARY OF THE INVENTION

Under such circumstances, it is an object of the present invention to provide an electron beam device to be employed for a high resolution scanning microscope provided with an in-lens type objective lens and capable of detecting electrons (dark-field signals) that scatter at large angles in a sample, then transmit the sample, which has been difficult to be detected, as well as provided with a mechanism capable of selecting a scattering angle range to enable observation of high contrast STEM images at high resolution in accordance with each sample and/or purpose.

In order to achieve the above object, the present invention disposes a dark-field image detector at a position closer to the lower magnetic pole of an objective lens, for example, between the sample and the lower magnetic pole of the objective lens, at a position under and close to the lower magnetic pole of the objective lens, or at a position under a place where electrons that transmit the sample are focused again and transmission electrons of which scattering angle in the sample is 100 mrad and over are detected. This disposition of the transmission electron detector thus makes it possible to detect transmission electrons having large scattering angles.

Furthermore, in order to control scattering angles of detected dark-field signals, the present invention disposes the dark-field transmission electron detector under and close to the lower magnetic pole of the objective lens and provides the electron beam device with means for moving this detector along the light axis. This makes it possible for the electron beam device to change the scattering angle range of transmission electrons detected by the dark-field detector, so that an optimized scattering angle range can be set for each sample.

Furthermore, the present invention provides the electron beam device with a bright-field detector for detecting transmission electrons (bright-field signal electrons) that transmit the dark-field detector so as to be disposed under the dark-field detector and disposes a deflector and a bright-field iris between the dark-field detector and the bright-field detector. This makes it possible for bright-field signals to pass the center of a desired bright-field iris to control the transmission electron detection area. An amount of bright-field signals that transmit a thin film sample depends on the thickness of the sample. Therefore, the present invention makes it possible to electrically select a large diameter bright-field iris for thick samples and a small diameter bright-field iris for thin samples. In addition, the present invention provides the electron beam device with means for dividing the detector of dark-field signal electrons into two or more detection elements so as to select or calculate a signal for each element to be detected. This means makes it possible to display high contrast information of only the electrons scattering and transmitting in a specific direction.

DETAILED DESCRIPTION OF THE PREFERRED EMBODIMENT

Hereunder, a preferred embodiment of the present invention will be described with reference to the accompanying drawings.

Figure 1:
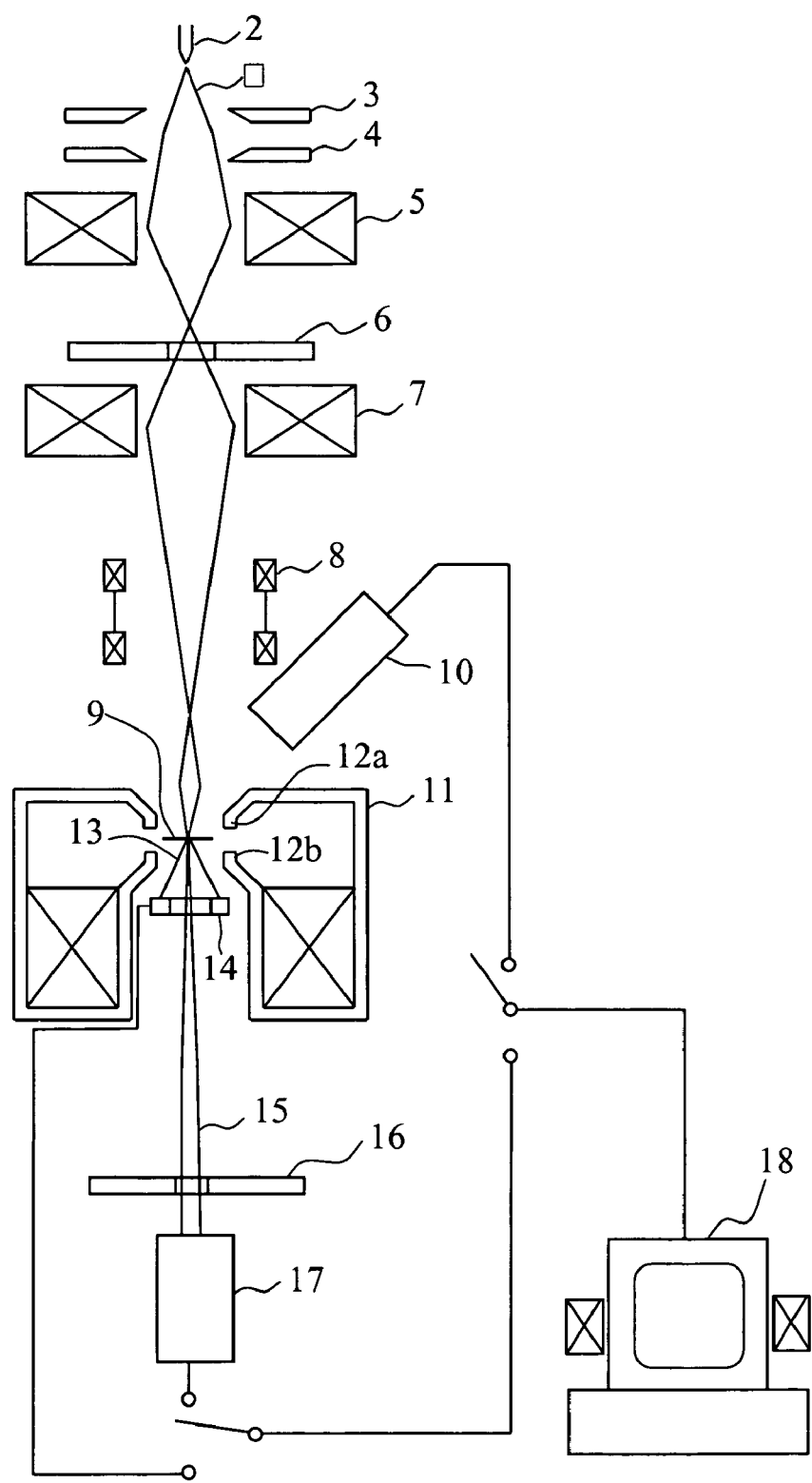
FIG. 1 is a schematic block diagram of a scanning electron microscope capable of observing STEM images in an embodiment of the present invention.
Figure 2:
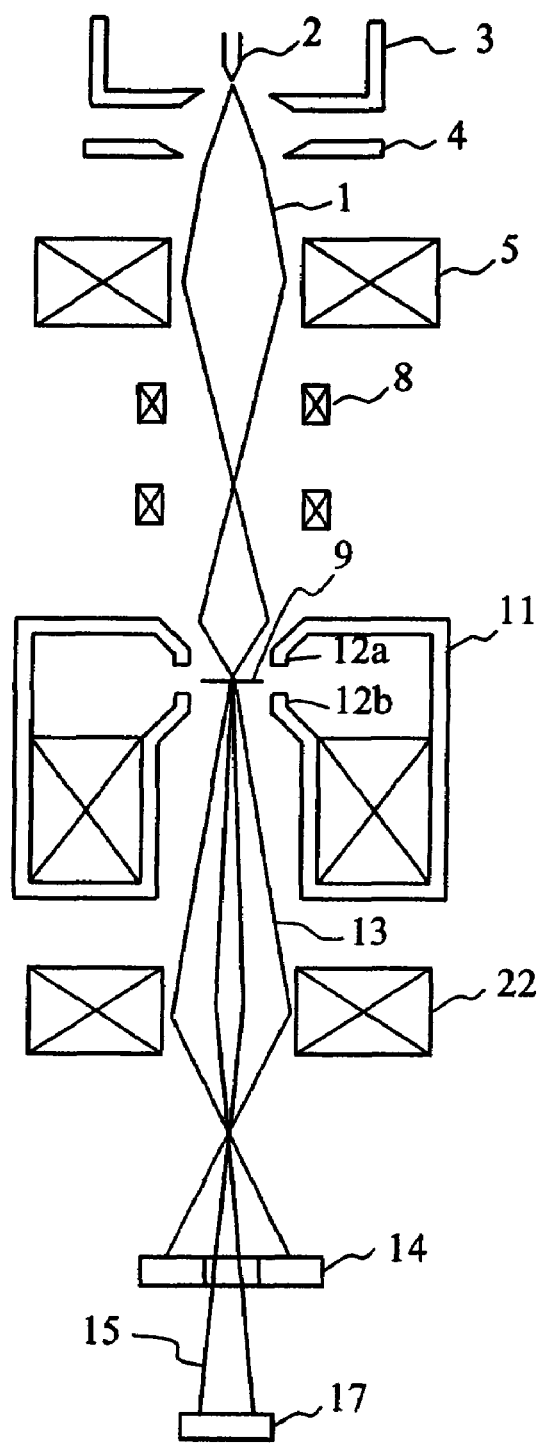
FIG. 2 is a block diagram of a general conventional STEM device.
Figure 3:
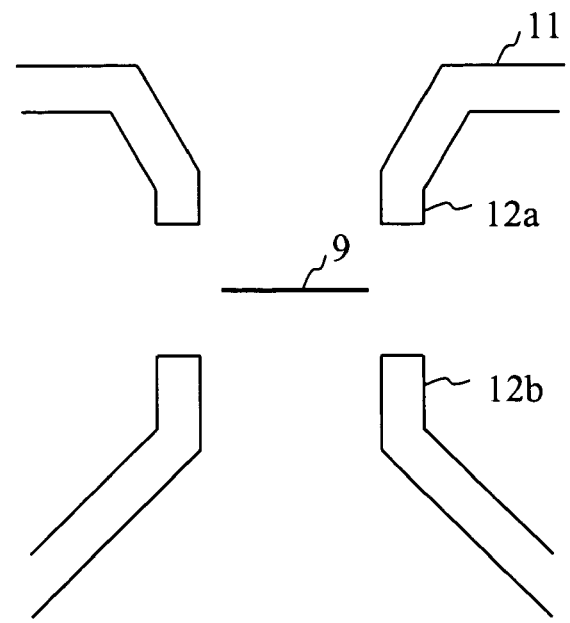
FIG. 3 is a rough illustration for denoting a positional relationship between upper and lower magnetic poles of an objective lens of the STEM device.
Figure 4:
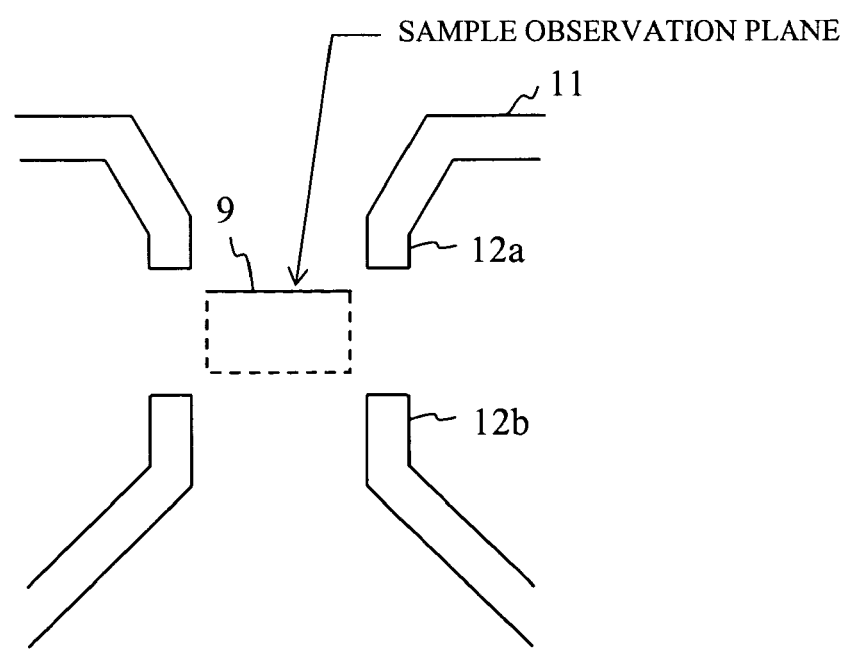
FIG. 4 is a rough illustration for denoting a positional relationship between upper and lower magnetic poles of the objective lens of the STEM device that is expected to use functions of the scanning electron microscope.

FIG. 1 shows a block diagram of a scanning electron microscope capable of observing STEM images in an embodiment of the present invention. In this embodiment, the present invention applies to an in-lens type scanning electron microscope.

In FIG. 1, an electron beam 1 emitted from an field-emission electron gun 2 due to the electric field generated by a lead electrode 3 to which a voltage of 3 to 6 kV is applied is accelerated by an anode 4 (to which a voltage of 0.5 to 30 kV is applied), then focused by a first focusing lens 5 (C1 lens), then unnecessary areas of the beam are removed by an objective lens iris 6. Passing through the objective lens iris 6, the electron beam 1 is focused into a still thinner beam by a second focusing lens 7 (C2 lens) and an objective lens 11. This thinner electron beam 1 is scanned two-dimensionally on a thin film sample 9 having a thickness of about 100 nm put in the objective lens 11 by a two-step deflection coil 8. The secondary (or reflected) electron emitted from the sample 9 is detected by a secondary electron detector (or reflection electron detector) 10 installed over the objective lens 11. The electron detected by the secondary detector (or reflected electron detector) 10 is then amplified by an amplifier to form a scanning electron microscope image on a CRT 18 synchronized with the deflection coil 8.

According to the present invention, the torus dark-field detector 14 is disposed closely to the objective lens lower magnetic pole 12b so as to detect transmission electrons (elastic scattering electrons) 13 of which scattering angle is 100 mrad and over. In the case of the conventional STEM device of which acceleration voltage is 200 kV, dark-field images of practical use are obtained if it can detect transmission electrons of which scattering angle is 50 mrad and over. If the acceleration voltage is 50 kV and under, however, it must detect transmission electrons of which scattering angle is at least 100 mrad and over to form dark-field images.

Figure 6:
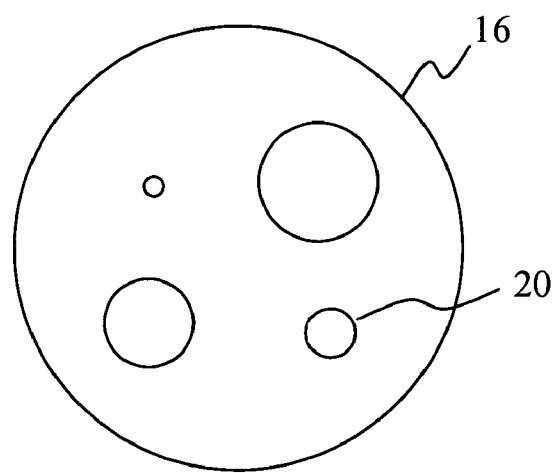
FIG. 6 is a rough illustration for describing a bright-field iris having two or more apertures.

Because the bright-field detector 17 is disposed under the dark-field detector 14, a bright-field iris 16 is provided between the dark-field detector 14 and the bright-field detector 17, and bright-field signals (non-scattering electrons+non-elastic scattering electrons) 15 that pass the apertures of the bright-field iris 16 are detected as described above, bright-field images are observed. The bright-field iris 16 has two or more apertures 20 structured as shown in FIG. 6 and different in size from each other. An amount of bright-field signals to be transmitted depends on the thickness of the thin film sample. Therefore, if the sample is thick, a large diameter bright-field iris is used to improve the S/N ratio. If the sample is thin, a small diameter bright-field iris is used to obtain high contrast information. The bright-field iris 16 shown in FIG. 6 has four apertures different in diameter from each other. However, the number of apertures of the bright-field iris 16 may be changed freely.

Figure 7:
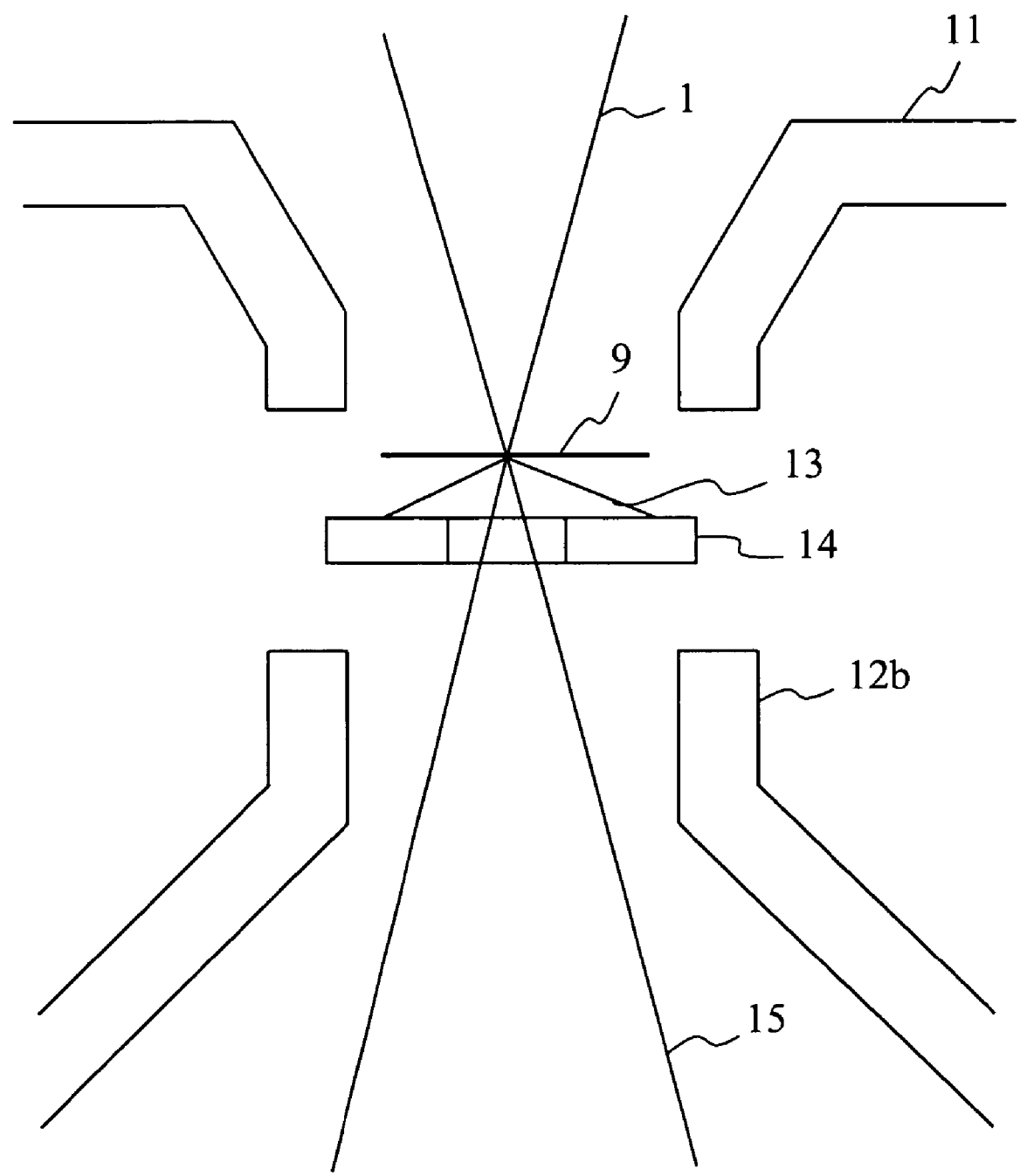
FIG. 7 is a rough illustration for denoting another disposition of the dark-field detector in the scanning electron microscope.

FIG. 7 shows another example for disposing the dark-field detector in the scanning electron microscope. In this example, the dark-field detector 14 is disposed between the sample 9 placed in the objective lens 11 and the objective lens lower magnetic pole 12b. This disposition of the dark-field detector as shown in FIG. 1 makes it possible for the dark-field detector 14 to detect electrons (elastic scattering electrons 13) having larger scattering angles than those detected when the dark-field detector 14 is disposed under the lower magnetic pole 12b of the objective lens 11 in the scanning electron microscope. This is because scattering electrons are not blocked by anything when the dark-field detector 14 is disposed under the lower magnetic pole 12b, although only the scattering electrons that are not disturbed by the hole diameter of the lower magnetic pole are detected when the dark-field detector 14 is disposed over the lower magnetic pole 12b. However, although the disposition of the detector 14 over the lower magnetic pole 12b such way has an advantage as described above, the sample inclination is limited. This is a disadvantage of the disposition method.

Figure 8:
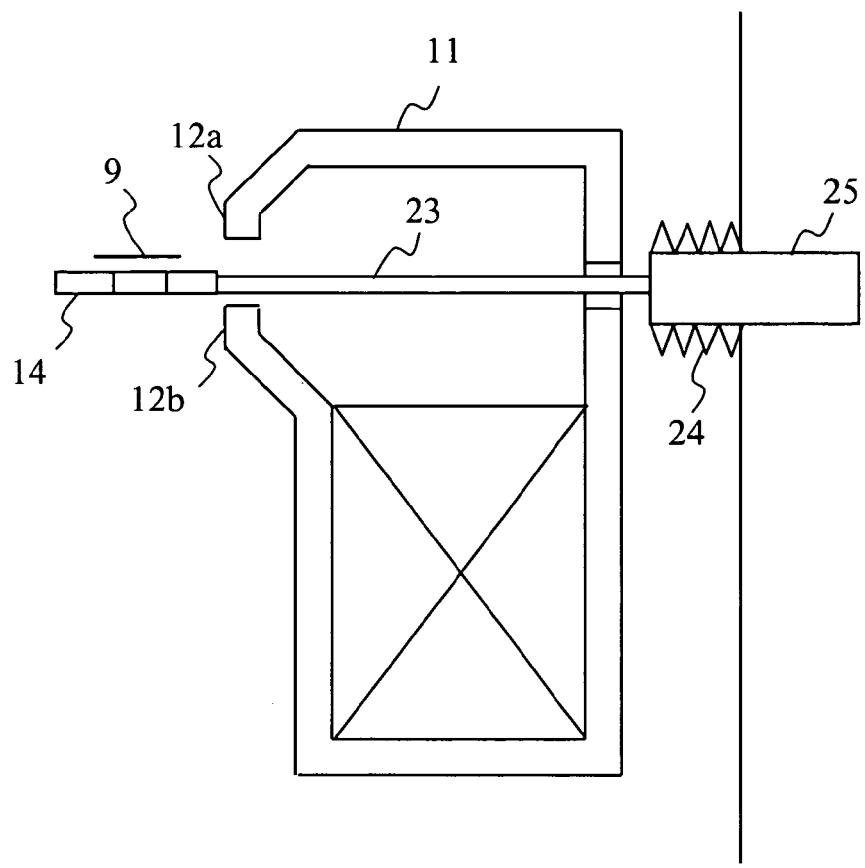
FIG. 8 is a rough illustration for denoting how a dark-field detector is disposed between a sample and the lower magnetic pole of the objective lens.

FIG. 8 shows an illustration for describing how a dark-field detector is disposed between a sample placed in an objective lens and an objective lens lower magnetic pole. The dark-field detector 14 is connected to an operation member 25 provided outside a mirror body through a support 23. The detector 14 is inserted from outside the mirror body and vacuum-sealed by a vacuum bellows 24. If the sample inclination angle is to increase for observing anything other than STEM images, the detector 14 can be taken out from above the light axis as needed.

Figure 9:
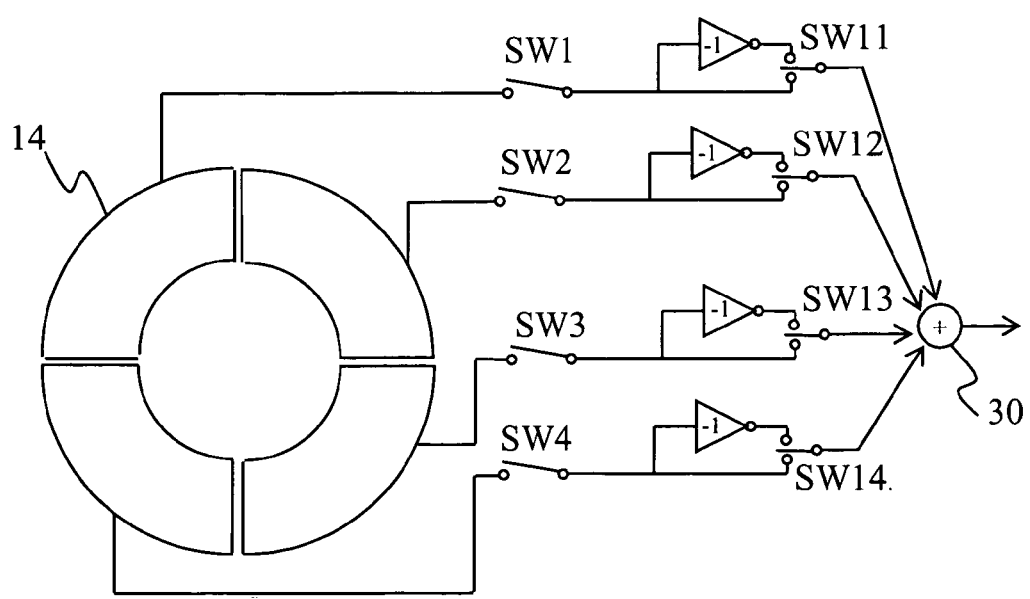
FIG. 9 is a schematic block diagram of divided dark-field detection elements.

The dark-field detector 14 may be divided into a plurality of detection elements in the circumferential direction as shown in FIG. 9. If the sample is a crystal, sometimes strong signals are output only in a specific direction due to the diffraction of transmission electrons. If the dark-field detector 14 is divided in such a case, signals having only a specific diffraction angle can be detected. Then, a dark-field signal detected in each divided dark-field detection element is output together with other signals detected by other elements. And, the present invention provides the microscope with means for selecting or calculating the signal from each specific detection element to display high contrast information of only the electrons that scatter and transmit in a specific direction. Although the detector 14 is divided into four detection elements in this embodiment, it may be divided into two or more freely, preferably, as many as possible. In this embodiment, one of the signals from those divided detection elements is selected by the switches SW1 to SW4, each of which then sets a subtraction/addition operation for each detection element. After that, only the signal selected by the signal addition circuit 30 is added to the object signal. Such a configuration of the electron beam device can thus select only the signal output from a desired detection element and/or observe a STEM image with the signals to/from which signals from the detection elements are added/subtracted.

Figure 5:
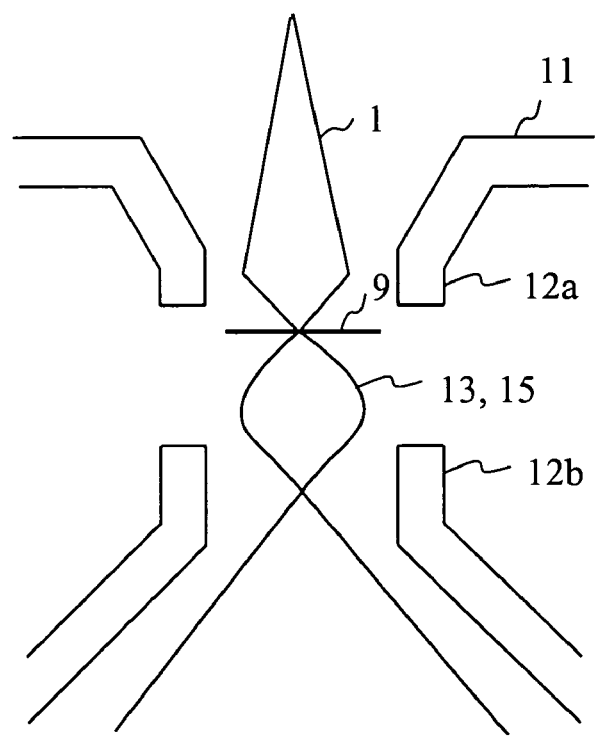
FIG. 5 is a rough illustration for describing the action of a lens of the lower magnetic pole of the objective lens.
Figure 10:
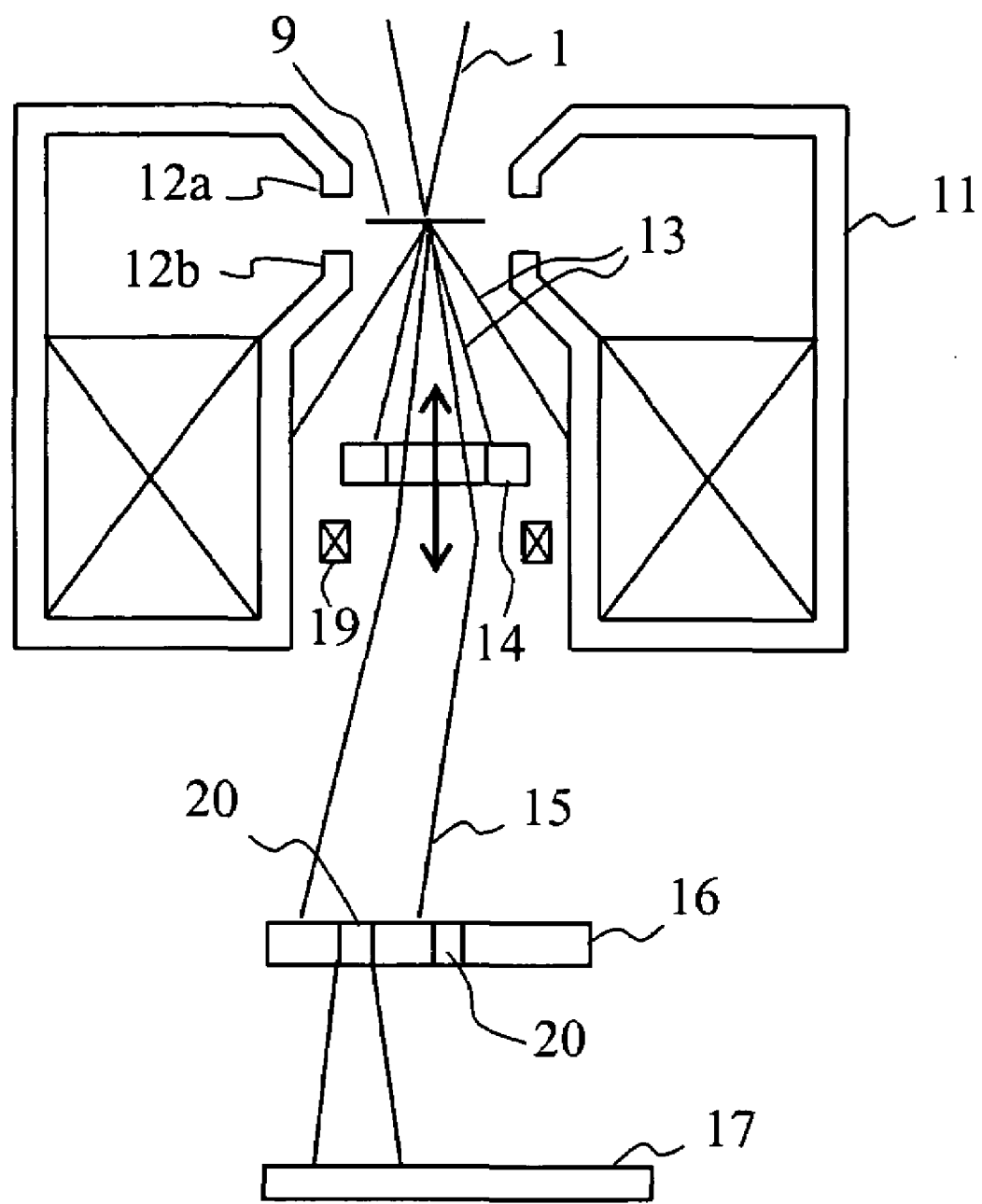
FIG. 10 is a schematic block diagram of a mechanism provided with a deflector for deflecting bight-field signals and used to move the dark-field detector along a light axis.

FIG. 10 shows a cross sectional view of the dark-field detector 14 disposed under the lower magnetic pole 12b of the objective lens 11. Although this disposition of the detector 14 comes to limit the detection angle with respect to each scattering angle up to a certain degree, the problem can be solved by disposing the detector 14 around the cross-over point of transmission electrons shown in FIG. 5; electrons can be detected at scattering angles of at least 100 mrad and over. In addition, the sample inclination is not limited, thereby loading/unloading of the detector 17 is omitted and the operation becomes easier. As described above, the deflector 19 for deflecting bright-field signals 15 is disposed between the dark-field detector 14 and the bright-field detector 16. And, the deflector 19 aligns bright-field signals 15 so that they pass through a desired iris hole 20. Consequently, a proper amount of signals can be obtained in accordance with the thickness of each sample during observation of bright-field images. If the sample is thin, bright-field images can be observed at still higher contrast.

The dark-field detector 14 is structured so that it is moved in the direction along the light axis as shown in FIG. 10. For example, the detector 14 is moved toward the lower magnetic pole 12b of the objective lens to detect transmission electrons having large scattering angles, such as heavy elements (ex., tungsten, Cu, etc.) included in the semiconductor sample and toward a position away from the magnetic pole of the objective lens to observe a sample mainly comprising light elements (ex., a living sample) (to detect transmission electrons having small scattering angles). Consequently, the scattering angle range of transmission electrons detected by the dark-field detector 14 can be changed freely. It is thus possible to obtain high contrast STEM images in a detection range set appropriately for each element included in the target thin film sample.

Figure 11A:
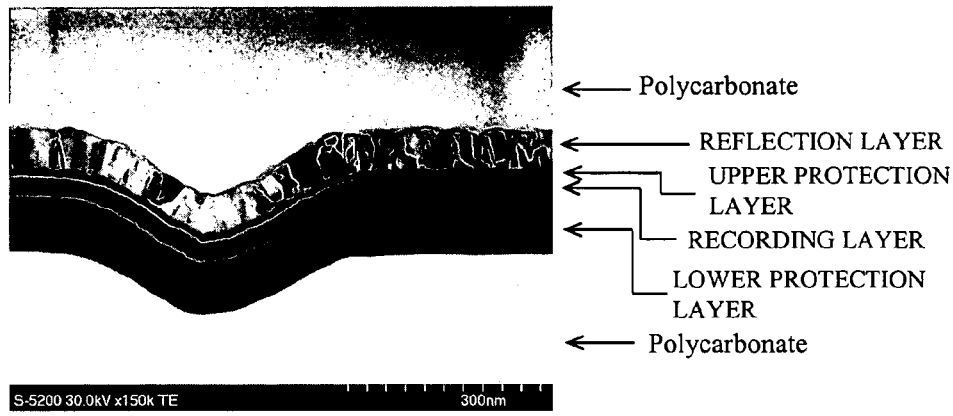
FIGS. 11A, 11B, and 11C are illustrations for describing a comparison among dark-field images according to a detected scattering angle difference.
Figure 11B:
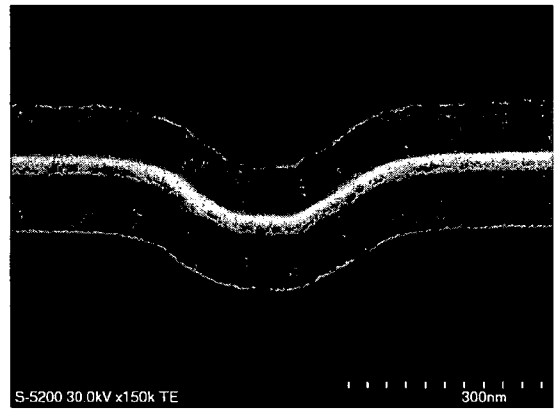
Figure 11C:
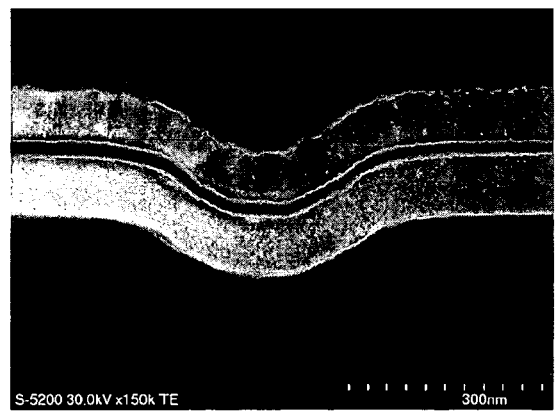

FIG. 11 shows an illustration for describing a comparison to be made between dark-field images that come to differ between scattering angle ranges. The sample is a thin MO disk. The illustration (a) denotes a bright-field image obtained by detecting only the electrons that transmit the sample without scattering in the sample. The illustration (b) denotes a dark-field image obtained by detecting transmission electrons having a scattering angle of 100 mrad and over and the illustration (c) denotes a dark-field image obtained by detecting transmission electrons having a scattering angle of 100 mrad and under. Because the detection angle is small and obtained signals are not enough in amount, the contrast is not inverted correctly with respect to the bright-field image in the recording layer. This figure shows that signals of larger scattering angles must be caught to obtain dark-field STEM images of heavy elements.

Figure 12A:
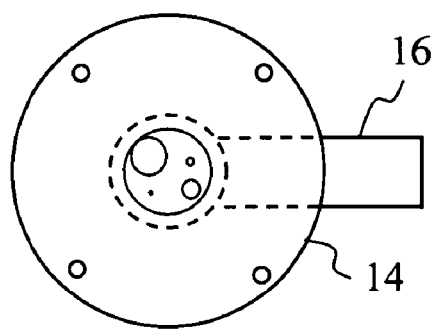
FIGS. 12A and 12B are block diagrams of moving means of the dark-field detector.
Figure 12B:
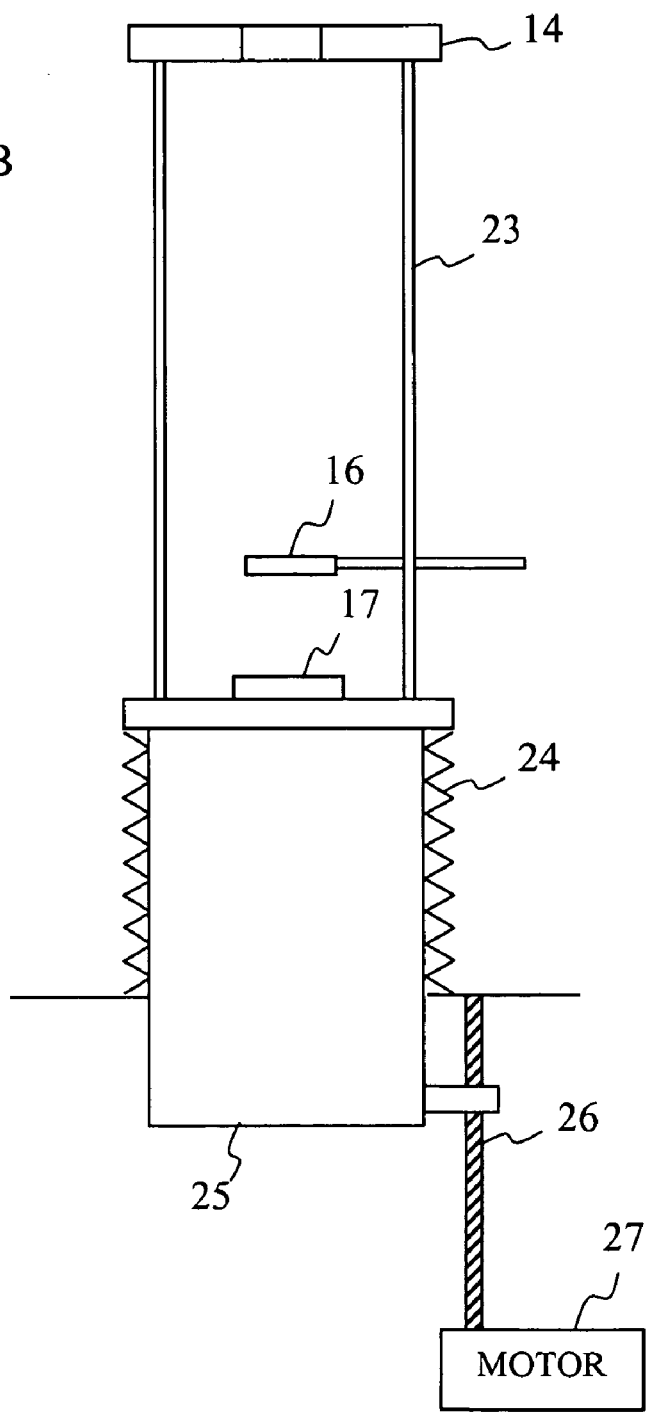

FIGS. 12A and 12B show a block diagram of the moving means of the dark-field detector 14. FIG. 12A shows a top view and FIG. 12B shows a side view. The moving means is driven by a motor.

The dark-field detector 14 is connected to an operation member 25 through a support 23. The operation member 25 is also connected to the bright-field detector 17. A bright-field iris 16 is fixed from a side of the mirror body between the dark-field detector 14 and the bright-field detector 17. The operation member 25 is vacuum-sealed by the vacuum bellows 24 and moved to the dark-field detector 14 along the light axis by a screw 26 driven by a motor 27.

According to the present invention, therefore, it is possible to detect electrons scattering widely in the target sample and transmitting the sample at a low acceleration voltage, and further to change the detection range of scattering electrons freely to detect only the dark-field signals at a specific diffraction angle, thereby high contrast STEM images are observed appropriately to each sample and purpose.

What is claimed is:

1. An electron beam device, comprising:
    means for accelerating an electron beam emitted from an electron source;
    an objective lens for focusing said accelerated electron beam on a sample;
    means for scanning said electron beam on said sample two-dimensionally;
    a transmission electron detector for detecting electrons transmitting said sample; and means for recording or displaying said sample with signals output from said transmission electron detector;

wherein said transmission electron detector is a dark-field detector through a center portion of which transmission electrons pass; and wherein said electron beam device also includes detector moving means for moving said dark-field detector along a light axis in an area under a lower magnetic pole of said objective lens.

2. The electron beam device according to claim 1, wherein said dark-field detector is structured so as to transmit electrons through its center portion; and wherein said electron beam device also includes a bright-field detector disposed under said dark-field detector, said bright-field detector being used to detect electrons transmitting said center portion of said dark-field detector.

3. The electron beam device according to claim 2, wherein said device further includes:

a bright-field iris having two or more apertures and being disposed between said dark-field detector and said bright-field detector; and alignment means for controlling the positions of electrons transmitting said center portion of said dark-field detector on said bright-field iris so that said electrons pass one of said apertures of said bright-field iris.

4. The electron beam device according to claim 1, wherein said dark-field detector is divided into two or more partial detectors in the circumferential direction; and wherein said electron beam device further includes a calculation device for selecting any of signals detected by partial detectors or adding/subtracting signals detected by said partial detectors to/from a signal to be output.

5. A method for measuring a sample comprising:

focusing an electron beam;

scanning a sample with the focused electron beam two-dimensionally;

detecting transmission electrons that have passed through the sample with a detector; and recording or displaying a sample image, wherein the detector is a dark-field detector through a center portion of which transmission electrons pass, said method further comprising moving said dark-field detector along the optical axis, positioning said dark-field detector at a particular position within a movable range of said dark-field detector, detecting transmission electrons that have passed through said sample, and recording or displaying a sample image.

* * * * *